US008969171B2

(12) United States Patent
Tseng et al.

(10) Patent No.: US 8,969,171 B2
(45) Date of Patent: Mar. 3, 2015

(54) METHOD OF MAKING DEEP TRENCH, AND DEVICES FORMED BY THE METHOD (71) Applicant: Taiwan Semiconductor Manufacturing Co., Ltd., Hsin-Chu (TW)

(72) Inventors: Yuan-Tai Tseng, Zhubei (TW); Chung-Yen Chou, Hsinchu (TW); Chia-Shiung Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/866,092

(22) Filed: Apr. 19, 2013

(65) Prior Publication Data
US 2014/0252534 A1 Sep. 11, 2014

Related U.S. Application Data (60) Provisional application No. 61/775,970, filed on Mar. 11, 2013.

(51) Int. Cl.
*H01L 21/311* (2006.01)
*H01L 21/762* (2006.01)
*H01L 21/308* (2006.01)

(52) U.S. Cl.
CPC ....... *H01L 21/76283* (2013.01); *H01L 21/3086* (2013.01); *H01L 21/3081* (2013.01)
USPC ................... 438/424; 257/E21.597; 438/479

(58) Field of Classification Search
CPC ............ H01L 21/3081; H01L 21/3086; H01L 21/76264; H01L 21/76804
USPC .......... 257/E21.597; 438/430, 479, 637, 639, 438/424
See application file for complete search history.

(56) References Cited

U.S. PATENT DOCUMENTS

| 6,696,365 | B2 * | 2/2004 | Kumar et al. ................. 438/706 |
| 7,341,952 | B2 * | 3/2008 | Tzou et al. ................... 438/706 |
| 8,021,943 | B2 * | 9/2011 | Botula et al. ................. 438/221 |
| 2008/0122025 | A1 * | 5/2008 | Roggenbauer et al. ....... 257/501 |

* cited by examiner

*Primary Examiner* — John C Ingham
(74) *Attorney, Agent, or Firm* — Duane Morris LLP (57) ABSTRACT

A method for forming a semiconductor device includes providing a semiconductor-on-insulator (SOI) structure, and forming at least one hard mask (HM) layer over the SOI structure. The SOI structure includes an insulator layer and a semiconductor layer over the insulator layer. The method further comprises forming a trench inside the at least one HM layer and the semiconductor layer, and depositing a spacer layer in the trench. The spacer layer comprises a bottom surface portion over the bottom surface of the trench, and a side wall portion along the side wall of the trench. The method further comprises etching the bottom surface portion of the spacer layer while the side wall portion of the spacer layer remains, and etching the insulator layer to extend the trench into the insulator layer.

20 Claims, 6 Drawing Sheets

METHOD OF MAKING DEEP TRENCH, AND DEVICES FORMED BY THE METHOD

This application claims the benefit of U.S. Provisional Application No. 61/775,970, filed Mar. 11, 2013, which application is expressly incorporated by reference herein in its entirety.

FIELD

The disclosed method and devices relate to semiconductors. More particularly, the disclosed subject matter relates to a method for making a deep trench isolation structure of a semiconductor device, and resulting device comprising a deep trench isolation structure.

BACKGROUND

Semiconductor devices such as complementary metal oxide semiconductor (CMOS) transistors continue to be scaled to smaller sizes to meet advanced performance targets. Fabrication of devices with such small dimensions involves precise control. For example, a method for forming a deep trench generally includes multiple steps of etching, deposition, and patterning. An increasing number of trench structures are fabricated in a limited space of a semiconductor substrate. The trenches should also be in good alignment with other device portions without any defects. Examples of applications of deep trench structures include deep trench isolations (DTI) and deep trench capacitors (DTC).

Meanwhile, as the semiconductor devices having very large scale integrated (VLSI) circuits shrink to a smaller size, and are operated at higher frequency, higher amounts of heat are generated. For example, CMOS transistors may generate a large amount of heat, which can cause undesired leakage currents. Therefore, heat removal techniques become important.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like reference numerals denote like features throughout specification and drawings.

DETAILED DESCRIPTION

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The present disclosure provides a method for making a semiconductor device, and the resulting semiconductor device. The method comprises a method of forming a semiconductor device having deep trench structures. In some embodiments, the semiconductor device comprises deep trench isolation (DTI) structures on semiconductor-on-insulator (SOI). A thermally conductive material can be filled into the deep trench. Such a semiconductor device can have different applications, for example, as a high voltage radio frequency (RF) device.

Figure 5:
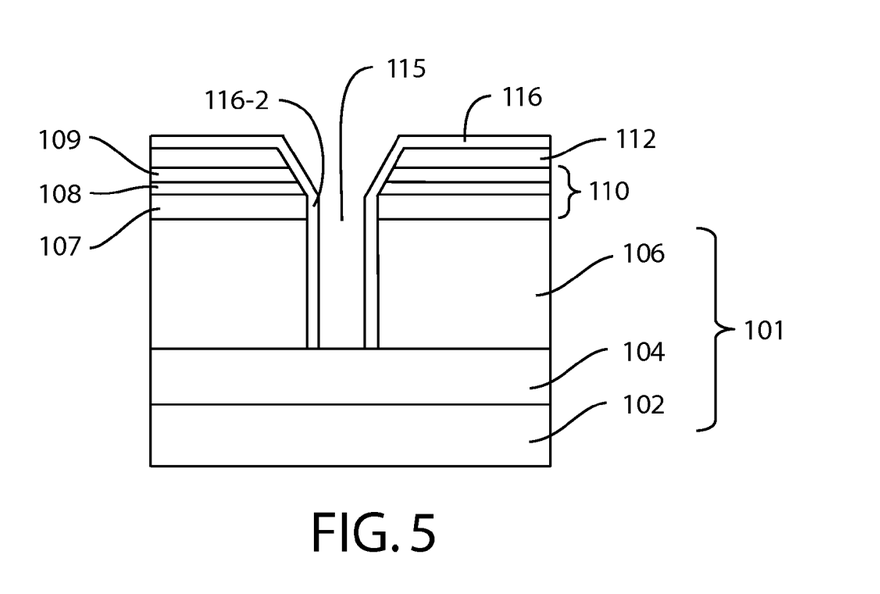
Figure 6:
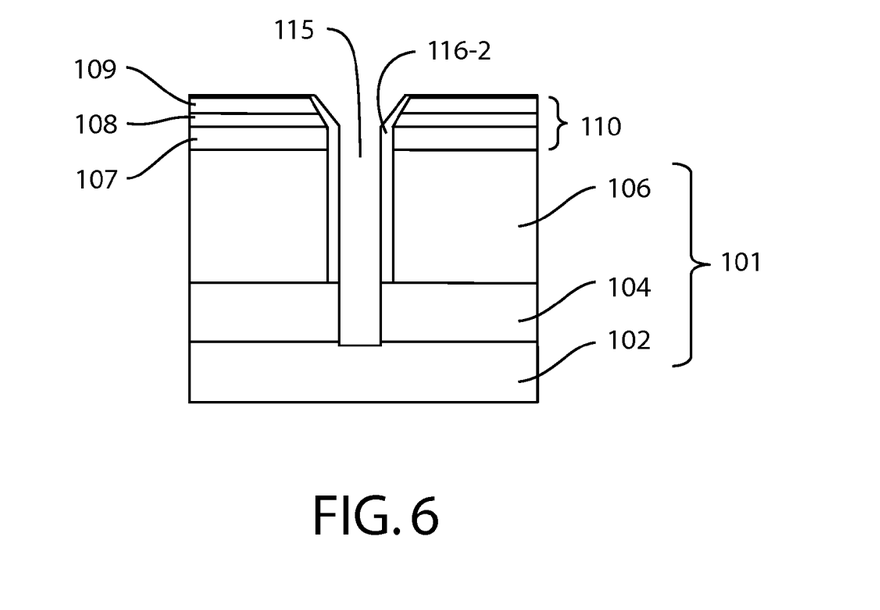
Figure 7:
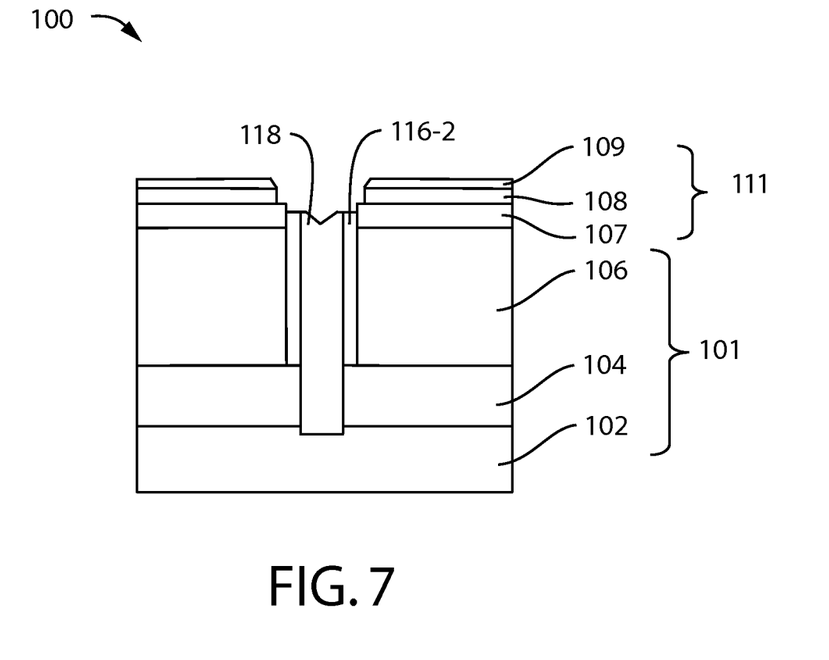
Figure 8:
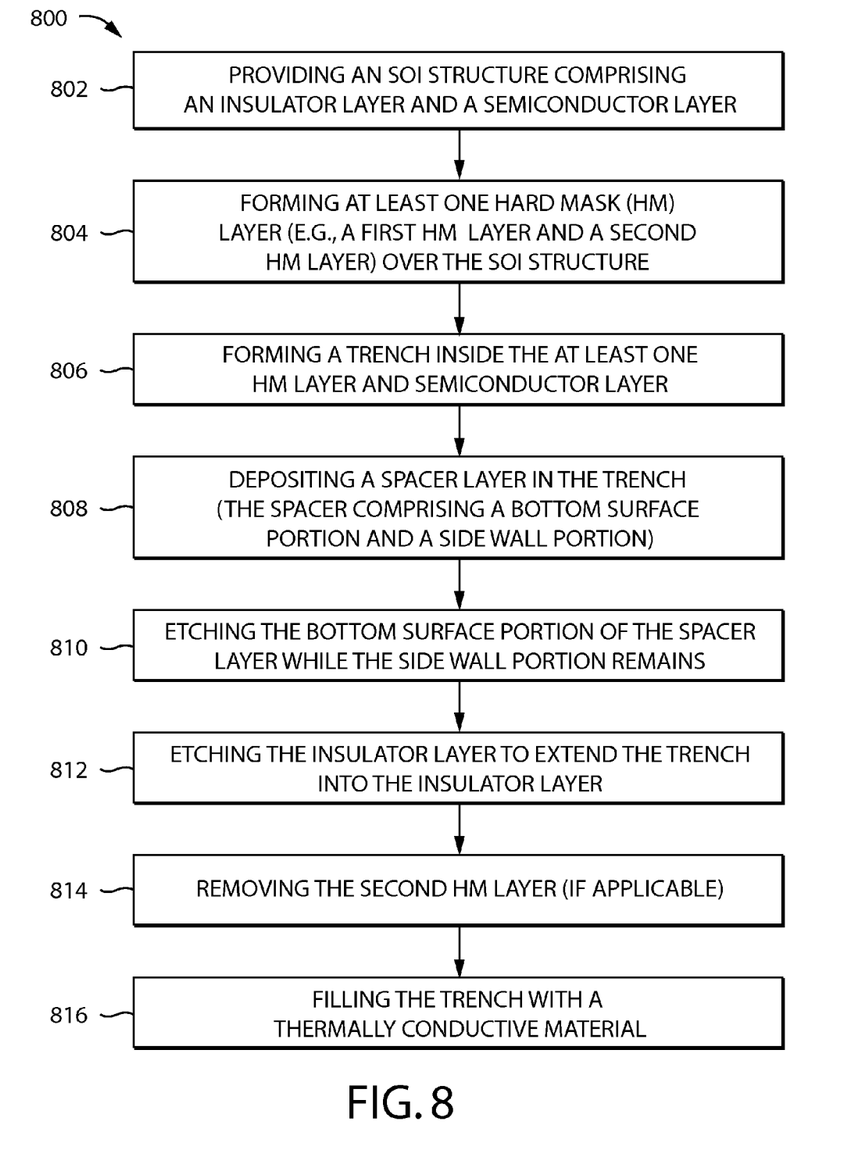
FIG. 8 is a flow chart illustrating an exemplary method for forming a semiconductor device in accordance with some embodiments.
Figure 9:
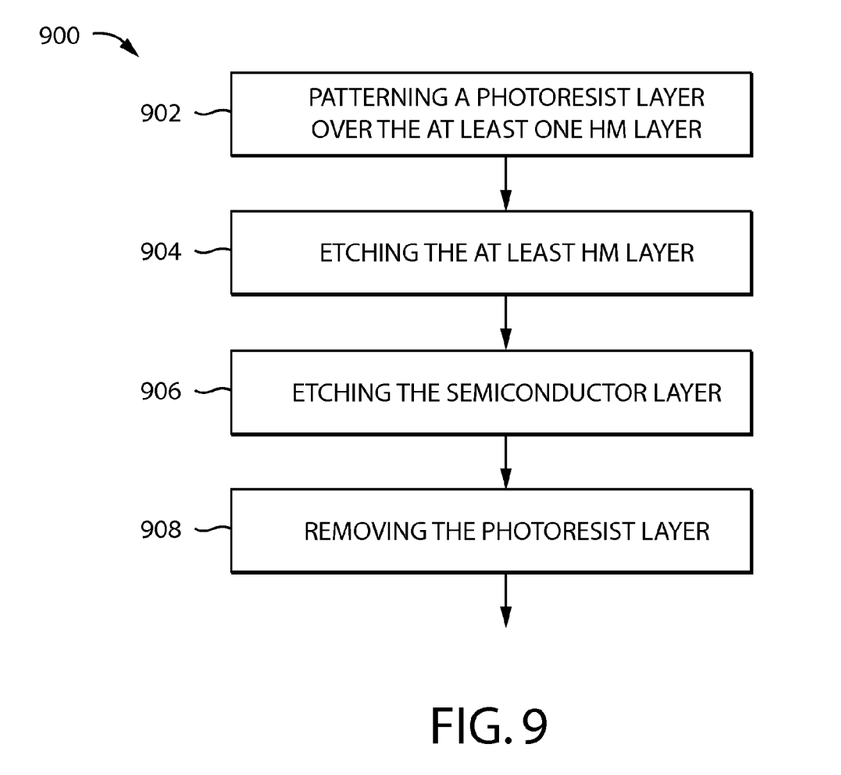
FIG. 9 is a flow chart illustrating a method for forming a trench in the exemplary method of FIG. 8 in some embodiments.

In FIGS. 1-7, like items are indicated by like reference numerals, and for brevity, descriptions of the structure, provided above with reference to the previous figures, are not repeated. The methods described in FIGS. 8-9 are described with reference to the exemplary structures described in FIGS. 1-7. FIG. 8 illustrates an exemplary method 800 for forming a semiconductor device 100 as shown in FIG. 7 in accordance with some embodiments.

Referring to FIG. 8, at step 802, semiconductor-on-insulator (SOI) structure 101 is provided. The SOI structure 101 includes an insulator layer 104 and a semiconductor layer 106 over insulator layer 104. In some embodiments, the SOI structure 101 further comprises a substrate 102. Insulator layer 104 is disposed over substrate 102.

Examples of suitable materials for substrate 102 include, but are not limited to, insulators such as glass. Examples of suitable materials for insulator layer 104 include, but are not limited to, silicon oxide, silicon nitride (e.g., $Si_3N_4$), SiON, SiC, SiOC, or any combination thereof. In some embodiments, insulator layer 104 is made of a barrier oxide or a dielectric material such as silicon oxide. Examples of a semiconductor layer 106 include, but are not limited to, silicon, germanium, and a compound semiconductor. A compound semiconductor can be an III-V semiconductor compound such as gallium arsenide (GaAs). Semiconductor layer 106 can be either n- or p-doped. Semiconductor layer 106 is silicon in some embodiments.

At step 804, at least one hard mask (HM) layer 111 is formed over the SOI structure 101. Examples of a suitable material for The at least one HM layer 111 include but are not limited to silicon oxide, silicon nitride (e.g., $Si_3N_4$), SiON, SiC, SiOC, or any combination thereof.

Figure 1:
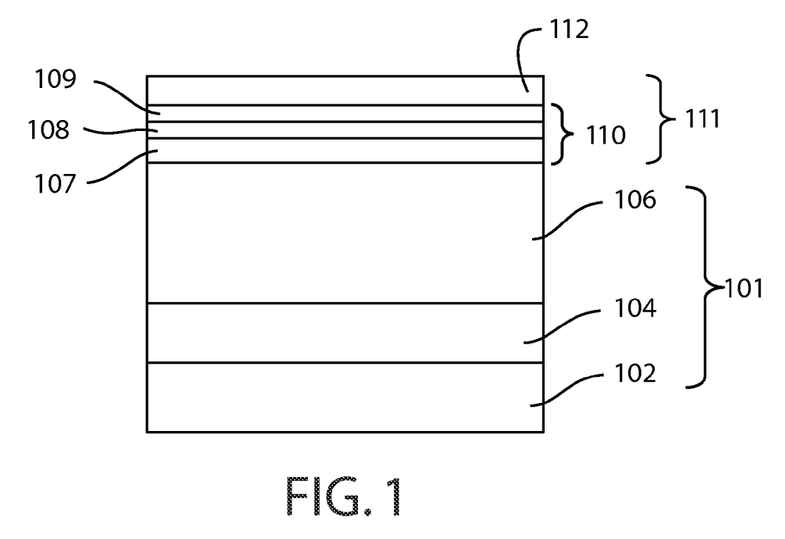
FIGS. 1-7 are cross-sectional views of a portion of semiconductor device during fabrication, illustrating a method of forming a semiconductor device in accordance with some embodiments.

The at least one HM layer 111 can be in a one-layer or multiple-layer structure. As shown in FIG. 1, in some embodiments, the at least one HM layer 111 comprises a first HM layer 110 (HM1), and a second HM layer 112 (HM2) over the first HM layer 110. For example, the first HM layer 110 has an oxide-nitride-oxide (ONO) structure comprising a first oxide layer 107, a nitride layer 108 over the first oxide layer 107, and a second oxide layer 109 over the nitride layer 108. In the three-layer structure of oxide-nitride-oxide (ONO) materials, the oxide layer can be silicon oxide. The nitride layer can be silicon nitride. In some embodiments, the at least one HM layer 111 has a two-layer structure of oxide-nitride (ON) or nitride-oxide (NO) materials. The oxide layer can be silicon oxide. The nitride layer can be silicon nitride. The second HM layer 112 can comprise silicon nitride in some embodiments.

Figure 3:
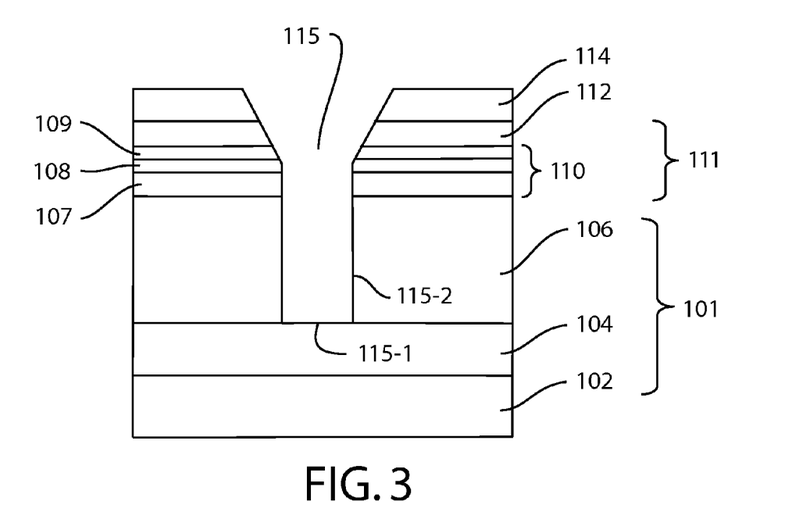

At step 806, a trench 115 is formed inside the at least one HM layer 111 and the semiconductor layer 106. The structure after step 806 is shown in FIG. 3. Trench 115 has a bottom surface 115-1 over the insulator layer 104 and a side wall 115-2 adjacent the at least one HM layer 111.

In some embodiments, the step 806 of forming a trench inside the at least one HM layer and semiconductor layer 106 comprises the following steps, as shown in FIG. 9.

Figure 2:
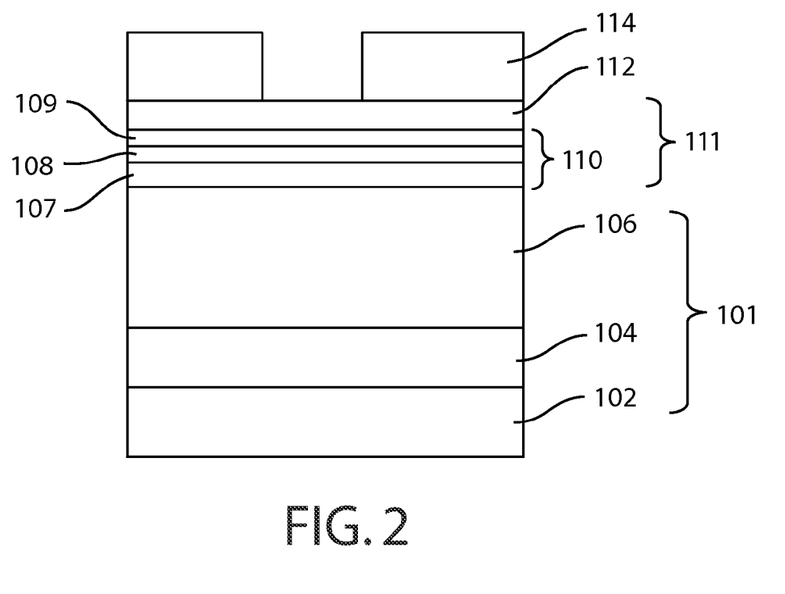

At step 902 of FIG. 9, a photoresist layer 114 is patterned over the at least one HM layer 111. The structure of FIG. 1 after step 902 is shown in FIG. 2. Photoresist layer 114 is coated over the at least one HM layer 111. Photoresist layer 114 can be formed of either a positive or a negative photoresist material. Photoresist layer 114 can be coated through spin-on or other suitable method. In some embodiments, patterning photoresist layer 114 can be performed using processes such as: spin coating of a photoresist 114, patterning the photoresist 114, etching the photoresist 114 to provide a pattern.

At step 904 of FIG. 9, the at least one HM layer 111 is etched. The at least one HM layer 111 can be etched using the photoresist pattern as a masking element, for example, using an etching process, and/or other suitable processes. In some embodiments, the first HM layer 110 and the second HM layer 112 can be etched through dry etching. For example, the dry etching process can be done using plasma comprising $CF_4/CHF_3$ 10-500 sccm in argon.

At step 906 of FIG. 9, the semiconductor layer 106 is etched to form a deep trench 115. The resulting structure after steps 904 and 906 is illustrated in FIG. 3. Semiconductor layer 106 can be etched through dry etching. For example, etching semiconductor layer 106 comprising silicon can be performed using plasma comprising $SF_6/CHF_3$ or HBr/chlorine at 10-200 sccm.

At step 908, the photoresist layer 114 is removed after forming the trench 115. Photoresist layer 114 can be completely removed through a dry or wet removal process. For example, photoresist layer 114 can be stripped by a solution comprising an ingredient such as $H_2SO_4$, $H_2O_2$, and $NH_4OH$.

Figure 4:
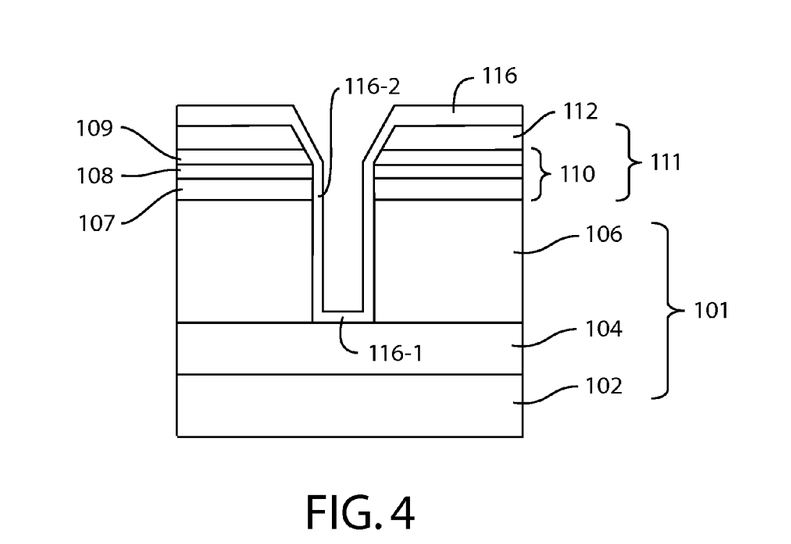

Referring back to FIG. 8, at step 808, a spacer layer 116 is deposited in the trench 115. FIG. 4 illustrates the device portion of FIG. 3 after processes of step 908 and 808. Spacer layer 116 comprises a bottom surface portion 116-1 over the bottom surface of the trench 115, and a side wall portion 116-2 along the side wall of the trench. Spacer layer 116 can be formed by using chemical vapor deposition (CVD), high density plasma CVD, sputtering, or other suitable method. Spacer layer 116 can be formed of oxides, nitrides, oxynitrides, combination thereof and other suitable insulating materials. In some embodiments, spacer 116 is formed of silicon nitrides (e.g., $Si_3N_4$).

At step 810, the bottom surface portion 116-1 of spacer layer 116 is etched while the side wall portion 116-2 of spacer layer 116 remains. The resulting structure after step 810 is shown in FIG. 5. The bottom surface portion 116-1 of spacer layer 116 can be etched through anisotropic etching (e.g., dry etching, for example, using plasma comprising $CF_4/CHF_3$ 10-500 sccm in argon).

At step 812, the insulator layer 104 is etched to extend the trench 115 into the insulator layer 104. Trench 115 is extended through the insulator layer 114 to the substrate 102 after step 812 in some embodiments. Trench 115 can be extended inside substrate 102 in some embodiments. Insulator layer 104 can be etched through dry etching, for example, using plasma comprising $C_4F_8/CO/O_2$ in argon. During step 812, a portion of spacer 116 horizontally over the second HM layer 112 can be also etched or totally removed.

At step 814, the second HM layer 112 is removed after the insulator layer 104 is etched to extend the trench 115 into the insulator layer 104 in some embodiments. The resulting structure after step 812 and 814 is illustrated in FIG. 6. The second HM layer 112 can be also etched through a dry etching condition, for example, using a fluorine containing plasma. Steps 814 and 812 can be performed through one-step etching.

At step 816 of FIG. 8, in some embodiments, a thermal plug 118 is formed by filling the trench 115 with a thermally conductive material. The resulting structure is illustrated in FIG. 7. Thermal plug 118 has high thermal conductivity to conduct heat from the device to substrate 102. But high electrical conductivity of thermal plug 118 is not desirable. In some embodiments, thermal plug 118 is made of an insulating material or a semiconductor material for the purpose of preventing electrical leakage. For example, the thermally conductive material for thermal plug 118 can have a thermal conductivity in the range of from 10 W/m·K to 100 W/m19 K, and an electrical conductivity in the range from $10^{-6}$ S/m to $10^3$ S/m. The thermally conductive material for thermal plug 118 has a thermal conductivity in the range of from 20 W/m·K to 50 W/m·K. The thermally conductive material for the thermal plug 118 is nonmetallic in some embodiments. Thermal plug 118 is made of polysilicon or any other suitable materials in some embodiments.

FIG. 7 illustrates a portion of an exemplary semiconductor device 100. As shown in FIG. 7, device 100 comprises a semiconductor-on-insulator (SOI) structure 101, at least one hard mask (HM) layer 111 over the SOI structure 101, a spacer layer 116-2 and a thermal plug 118. The SOI structure 101 comprises a substrate 102, an insulator layer 104 over substrate 102, and a semiconductor layer 106 over insulator layer 104. The at least one HM layer 111 and the SOI structure 101 comprise a trench 115 inside the at least one HM layer 111, semiconductor layer 106, and insulator layer 104.

In some embodiments, the at least one HM layer 111 comprises a first HM layer 110 having an oxide-nitride-oxide (ONO) structure as described. The ONO structure comprises a first oxide layer 107, a nitride layer 108 over the first oxide layer 107, and a second oxide layer 109 over the nitride layer 108.

Spacer layer 116-2 is disposed along a side wall of the trench 115 abutting the semiconductor layer, but the spacer layer 116-2 is not disposed along a side wall of insulator layer 104. Spacer layer 116-2 is electrically insulating in some embodiments. Spacer layer 116-2 is silicon nitride or any other suitable material.

Thermal plug 118 is filled inside trench 115. Thermal plug 118 can comprise a thermally conductive material, such as polysilicon and other suitable materials. In some embodiments, thermal plug 118 is not connected with the semiconductor layer 106. Thermal plug 118 can be electrically separated from semiconductor layer 106 by spacer layer 116-2. Thermal plug 118 abuts substrate 102 or extends into substrate 102 in some embodiments.

The present disclosure provides a method for forming a semiconductor device, and the resulting semiconductor device. The method comprises providing a semiconductor-on-insulator (SOI) structure, and forming at least one hard mask (HM) layer over the SOI structure. The SOI structure includes an insulator layer and a semiconductor layer over the insulator layer. The method further comprises forming a trench inside the at least one HM layer and the semiconductor layer, and depositing a spacer layer in the trench. The trench has a bottom surface over the insulator layer and a side wall adjacent the at least one HM layer. The spacer layer comprises a bottom surface portion over the bottom surface of the trench, and a side wall portion along the side wall of the trench. The method further comprises etching the bottom surface portion of the spacer layer while the side wall portion of the spacer layer remains, and etching the insulator layer to extend the trench into the insulator layer. In some embodiments, the method further comprises removing the photoresist layer after forming the trench and before depositing a spacer layer over the trench. In some embodiments, the method further comprises filling the trench with a thermally conductive material.

In some embodiments, the step of forming a trench inside the at least one HM layer and the semiconductor layer comprises patterning a photoresist layer over the at least one HM layer, etching the at least one HM layer, and etching the semiconductor layer. In some embodiments, the SOI structure further comprises a substrate. The insulator layer is disposed over the substrate. The trench is extended through the insulator layer to the substrate after the step of etching the insulator layer. In some embodiments, the at least one HM layer comprises a first HM layer, and a second HM layer over the first HM layer. For example, the first HM layer has an oxide-nitride-oxide (ONO) structure comprising a first oxide layer, a nitride layer over the first oxide layer, and a second oxide layer over the nitride layer. The second HM layer can comprise silicon nitride. In some embodiments, the second HM layer is removed after the insulator layer is etched to extend the trench into the insulator layer.

In some embodiments, the present disclosure provides an exemplary method for forming a semiconductor device. The method comprises providing a semiconductor-on-insulator (SOI) structure. The SOI structure comprises a substrate, an insulator layer over the substrate, and a semiconductor layer over the insulator layer. The method further comprises forming at least one hard mask (HM) layer over the SOI structure, and forming a trench inside the at least one HM layer and the semiconductor layer. The trench has a bottom surface over the insulator layer and a side wall shared with the at least one HM layer. The method further comprises depositing a spacer layer in the trench. The spacer layer comprises a bottom surface portion over the bottom surface of the trench, and a side wall portion along the side wall of the trench. The method further comprises etching the bottom surface portion of the spacer layer while the side wall portion of the spacer layer remains, and etching the insulator layer to extend the trench through the insulator layer to the substrate. In some embodiments, the step of forming a trench inside the at least one HM layer and the semiconductor layer comprises patterning a photoresist layer over the at least one HM layer, etching the at least one HM layer, and etching the semiconductor layer. In some embodiments, the method further comprises removing the photoresist layer after forming the trench and before depositing the spacer layer in the trench, and filling the trench with a thermally conductive material, the thermally conductive material being nonmetallic. In some embodiments, the at least one HM layer comprises a first HM layer, and a second HM layer over the first HM layer. The first HM layer comprises an oxide-nitride-oxide (ONO) structure having a first oxide layer, a nitride layer over the first oxide layer, and a second oxide layer over the nitride layer. The second HM layer comprises silicon nitride. The method further comprises removing the second HM layer after etching the insulator layer to extend the trench into the insulator layer.

The present disclosure also provides a semiconductor device. The device comprises a semiconductor-on-insulator (SOI) structure, at least one hard mask (HM) layer over the SOI structure, a spacer layer and a thermal plug. The SOI structure comprises a substrate, an insulator layer over the substrate, and a semiconductor layer over the insulator layer. The at least one HM layer and the SOI structure comprise a trench inside the at least one HM layer, the semiconductor layer, and the insulator layer. The spacer layer comprises a portion disposed along a side wall of the trench abutting the semiconductor layer, but the spacer layer is not disposed along a side wall of the insulator layer. The thermal plug is filled inside the trench.

In some embodiments, the thermal plug comprises a thermally conductive material. In some embodiments, the spacer layer is electrically insulating; and the thermal plug is not connected with the semiconductor layer. In some embodiments, the at least one HM layer comprises a first HM layer having an oxide-nitride-oxide (ONO) structure, the ONO structure comprising a first oxide layer, a nitride layer over the first oxide layer, and a second oxide layer over the nitride layer. The spacer layer comprises silicon nitride. In some embodiments, the thermal plug comprises polysilicon. The thermal plug abuts the substrate in some embodiments.

Although the subject matter has been described in terms of exemplary embodiments, it is not limited thereto. Rather, the appended claims should be construed broadly, to include other variants and embodiments, which may be made by those skilled in the art.

What is claimed is:

1. A method for forming a semiconductor device, comprising:
   providing a semiconductor-on-insulator (SOI) structure comprising an insulator layer, and a semiconductor layer over the insulator layer;
   forming at least one hard mask (HM) layer over the SOI structure, the at least one HM layer comprising a first VIM layer, and a second. HM layer over the first HM laver;
   forming a trench inside the at least one HM layer and the semiconductor layer, the trench having a bottom surface over the insulator layer and a side wall adjacent the at least one HM layer;
   depositing a spacer layer in the trench, the spacer layer comprising a bottom surface portion over the bottom surface of the trench, and a side wall portion along the side wall of the trench;
   etching the bottom surface portion of the spacer layer while the side wall portion of the spacer layer remains;
   etching the insulator layer to extend the trench into the insulator layer; and
   removing the second HM layer alter etching the insulator layer to extend the trench into the insulator layer.

2. The method of claim 1, wherein the step of forming a trench inside the at least one HM layer and the semiconductor layer comprises:
   patterning a photoresist layer over the at least one HM layer;
   etching the at least one HM layer; and
   etching the semiconductor layer.

3. The method of claim 2, further comprising
   removing the photoresist layer after forming the trench and before depositing a spacer layer over the trench.

4. The method of claim 1, further comprising:
   filling the trench with a thermally conductive material.

5. The method of claim 1, wherein
the SOI structure further comprises a substrate, wherein the insulator layer is disposed over the substrate; and
the trench is extended through the insulator layer to the substrate after the step of etching the insulator layer.

6. The method of claim 1, wherein
the first HM layer has an oxide-nitride-oxide (ONO) structure comprising a first oxide layer, a nitride layer over the first oxide layer, and a second oxide layer over the nitride layer.

7. The method of claim 1, wherein
the second HM layer comprises silicon nitride.

8. A method for forming a semiconductor device, comprising:
providing a semiconductor-on-insulator (SOT) structure comprising a substrate, an insulator layer over the substrate, and a semiconductor layer over the insulator layer;
forming at least one hard mask (HM) layer over the SOI structure, the at least one HM layer comprising a first HM layer, and a second HM layer over the first HM layer;
forming a trench inside the at least one HM layer and the semiconductor layer, the trench having a bottom surface over the insulator layer and a side wall shared with the at least one HM layer;
depositing a spacer layer in the trench, the spacer layer comprising a bottom surface portion over the bottom surface of the trench, and a side wall portion along the side wall of the trench;
etching the bottom surface portion of the spacer layer while the side wall portion of the spacer layer remains;
etching the the insulator layer to extend the trench through the insulator layer to the Substrate; and
removing the second HM layer after etching the insulator layer to extend the trench into the insulator layer.

9. The method of claim 8, wherein the step of forming a trench inside the at least one HM layer and the semiconductor layer comprises:
patterning a photoresist layer over the at least one HM layer;
etching the at least one HM layer; and
etching the semiconductor layer.

10. The method of claim 9, further comprising
removing the photoresist layer after forming the trench and before depositing the spacer layer in the trench; and
filling the trench with a thermally conductive material, the thermally conductive material being nonmetallic.

11. The method of claim 8, wherein
the first HM layer comprises an oxide-nitride-oxide (ONO) structure having a first oxide layer, a nitride layer over the first oxide layer, and a second oxide layer over the nitride layer; and
the second HM layer comprises silicon nitride.

12. A semiconductor device, comprising:
a semiconductor-on-insulator (SOI) structure comprising a substrate, an insulator layer over the substrate, and a semiconductor layer over the insulator layer, the substrate being an insulator;
at least one hard mask (HM) layer over the SOI structure, the at least one HM layer and the SOI structure comprising a trench inside the at least one HM layer, the semiconductor layer, and the insulator layer;
a spacer layer, the spacer layer comprising a portion disposed along a side wall of the trench abutting the semiconductor layer, but not disposed along a side wall of the insulator layer; and
a thermal plug comprising a thermally conductive material filled inside the trench, the thermal plug having a bottom portion directly contacting the insulator or the substrate.

13. The semiconductor device of claim 12, wherein
the spacer layer is electrically insulating; and the thermal plug is not connected with the semiconductor layer.

14. The semiconductor device of claim 12, wherein
the at least one HM layer comprises a first HM layer having an oxide-nitride-oxide (ONO) structure, the ONO structure comprising an first oxide layer, a nitride layer over the first oxide layer, and a second oxide layer over the nitride layer.

15. The semiconductor device of claim 12, wherein
the spacer layer comprises silicon nitride; and
the thermal plug comprises polysilicon.

16. The semiconductor device of claim 12, wherein the thermal plug abuts the substrate.

17. The semiconductor device of claim 12, wherein the thermal plug comprises an insulating material or a semiconductor material.

18. The semiconductor device of claim 12, wherein the thermal plug has a thermal conductivity in the range of from 10W/m.K to 100W/m.K, and an electrical conductivity in the range from $10^{-6}$ S/m to $10^3$ S/m.

19. The semiconductor device of claim 18, wherein the thermal plug has a thermal conductivity in the range of from 20W/m.K to 50W/m.K.

20. The semiconductor device of claim 12, wherein the thermal plug is nonmetallic.

* * * * *

UNITED STATES PATENT AND TRADEMARK OFFICE
CERTIFICATE OF CORRECTION

PATENT NO.        : 8,969,171 B2  
APPLICATION NO.   : 13/866092  
DATED             : March 3, 2015  
INVENTOR(S)       : Yuan-Tai Tseng et al.

Page 1 of 1

It is certified that error appears in the above-identified patent and that said Letters Patent is hereby corrected as shown below:

IN THE CLAIMS:

Claim 1, Column 6, Line 40, delete "VIM" and insert -- HM --; delete the "." after the word "second".

Claim 1, Column 6, Line 41, delete "laver" and insert -- layer --.

Claim 1, Column 6, Line 54, delete "alter" and insert -- after --.

Claim 8, Column 7, Line 16, delete "(SOT)" and insert -- (SOI) --.

Claim 8, Column 7, Line 34, delete "the" after the word "etching".

Claim 8, Column 7, Line 35, delete "Substrate" and insert -- substrate --.

Signed and Sealed this  
Twelfth Day of April, 2016

Michelle K. Lee  
*Director of the United States Patent and Trademark Office*